United States Patent [19]

Catalano

[11] Patent Number: 4,845,043
[45] Date of Patent: Jul. 4, 1989

[54] METHOD FOR FABRICATING PHOTOVOLTAIC DEVICE HAVING IMPROVED SHORT WAVELENGTH PHOTORESPONSE

[76] Inventor: Anthony W. Catalano, P.O. Box 557, Rushland, Pa. 18956

[21] Appl. No.: 41,532

[22] Filed: Apr. 23, 1987

[51] Int. Cl.[4] .................... H01L 31/18; H01L 21/20
[52] U.S. Cl. ........................................ 437/4; 437/100; 437/101; 437/108; 427/74; 136/258
[58] Field of Search .................... 437/2, 4, 100, 101, 437/106, 108–110; 427/74, 39; 136/258 AM; 357/30 F, 30 J, 30 K

[56] References Cited

U.S. PATENT DOCUMENTS

| | | | |
|---|---|---|---|
| 4,064,521 | 12/1977 | Carlson | 357/2 |
| 4,385,200 | 5/1983 | Hamakawa et al. | 136/258 |
| 4,410,559 | 10/1983 | Hamakawa et al. | 427/39 |
| 4,443,529 | 4/1984 | Kanbe et al. | 430/65 |
| 4,453,173 | 6/1984 | Carlson et al. | 357/30 |
| 4,492,605 | 1/1985 | Ishihara et al. | 437/113 |
| 4,514,583 | 4/1985 | Izu et al. | 136/259 |
| 4,522,905 | 6/1985 | Ogawa et al. | 430/60 |
| 4,529,679 | 7/1985 | Ogawa et al. | 430/84 |

FOREIGN PATENT DOCUMENTS

| | | | |
|---|---|---|---|
| 58-92217 | 6/1983 | Japan | 136/258 AM |
| 59-92519 | 5/1984 | Japan | 136/258 AM |

OTHER PUBLICATIONS

C. R. Dickson et al, *Solar Cells,*, vol. 19, pp. 179–188 (1986–87).
Kausche et al., "Influence of Plasma Etching in a Multi Chamber System on a-Si Solar Cell Performance," Comm. Eur. Communities, [Rep.] EUR 1984, EUR 9007, Photovoltaic Sol. Energy Energy Conf., Proc. Int. Conf., 5th, 1983 pp. 707–711.
Furukawa, "Chemical Vapor Deposition of Insulating Films Using Nitrogen Trifluoride," Jpn. J. Appl. Phys. vol. 23 (1984), No. 3, pp. 376–377.

*Primary Examiner*—Aaron Weisstuch
*Attorney, Agent, or Firm*—Finnegan, Henderson, Farabow, Garrett & Dunner

[57] ABSTRACT

Amorphous p-i-n silicon photovoltaic cells with improved short wavelength photoresponse are fabricated with reduced p-dopant contamination at the p/i interface. Residual p-dopants are removed by flushing the deposition chamber with a gaseous mixture capable of reacting with excess doping contaminants prior to the deposition of the i-layer and subsequent to the deposition of the p-layer.

26 Claims, 1 Drawing Sheet

METHOD FOR FABRICATING PHOTOVOLTAIC DEVICE HAVING IMPROVED SHORT WAVELENGTH PHOTORESPONSE

BACKGROUND OF THE INVENTION

The present invention relates to photovoltaic devices containing amorphous silicon and having improved short wavelength photoresponse. More particularly, the present invention relates to thin-film amorphous silicon p-i-n devices having reduced p-dopant contamination of the i-layer neat the p/i interface and their method of manufacture.

Photovoltaic devices such as, for example, solar cells and photodetectors are capable of converting solar radiation into usable electrical energy. These devices may be fabricated by sandwiching certain semiconductor materials between two electrical contacts. As disclosed in U.S. Pat. No. 4,064,521, which is incorporated herein by reference to the extent necessary to effect a thorough understanding of the background of the present invention, one semiconductor material that can be used is a body of amorphous silicon deposited by glow discharge in silane. Photovoltaic devices utilizing amorphous silicon typically contain one or more p-i-n or inverted p-i-n junctions.

The photoresponse of such thin-film amorphous silicon p-i-n devices to light whose wavelength lies between 400-560 nanometers is less effficient than expected from measurements of the optical absorption of the overlying layers. The short wavelength, i.e., "blue," response of the device may be low for several reasons: the electric field at the p/i interface may be weak, slowing carrier transport and permitting more carriers to recombine; the electron or hole lifetime may be reduced at the front of the device due to contamination; and interface recombination at the p/i interface may remove carriers and prevent their collection.

It has been experimentally observed that the presence of a p-type dopant such as boron in amorphous silicon devices and in the amorphous silicon deposition system lowers blue response. Tests were conducted on amorphous silicon p-i-n devices utilizing a silicon carbide p-layer fabricated in a single glow discharge deposition chamber batch system. Such devices were prepared using a 50/50 mixture of silane and methane for the p-layers. The only variable in the experiment was the concentration of diborane used in the doping of the p-layer, which varied between approximately 0.1% to 0.3%. I have found that the blue response of the devices decreased monotonically with increasing boron content of the p-layer. Measurements of the quantum efficiency as a function of electrical bias confirmed a reduction in the effective collection length at short wavelengths; the collection length at longer wavelengths was affected to a lesser degree.

SUMMARY OF THE INVENTION

It is an object of this invention to produce a p-i-n junction amorphous silicon photovoltaic cell having improved photoresponse to short wavelength light. I have found that it is possible to improve the blue response of such devices by reducing the residual p-layer dopant contamination at the p/i interface and the nearby region of the i-layer. The present invention overcomes the problems of the prior art photovoltaic devices and methods for fabricating such devices by flushing the glow discharge deposition chamber immediately prior to the deposition of the i-layer with an oxidizing agent capable of substantially removing (gettering) residual p-doping contaminants in a gaseous state.

It is postulated that boron may effuse out of the p-layer to contaminate the subsequent deposition of the i-layer, or that excess boron in the p-layer gives rise to interface states which enhance carrier recombination and degrade performance. Additionally, in a single glow discharge deposition chamber system where the internal chamber surfaces including the cathode are coated with the p-layer material, susbsequent depositions may sputter boron off the chamber walls to contaminate the undoped i-layer. If this is indeed the case, it will be possible to remove the residual boron by reacting the diborane, a powerful reducing agent, with an oxidizer such as, for example, nitrogen trifluoride. The two gases react in accordance with the following formula:

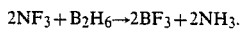

$$2NF_3 + B_2H_6 \rightarrow 2BF_3 + 2NH_3.$$

The reaction products are gases which can be pumped away prior to the deposition of the i-layer.

Evidence that this procedure reduces boron contamination of the i-layer of p-i-n amorphous silicon solar cells has been obtained using secondary ion mass spectroscopy depth profiles through the p/i interface of specially prepared samples. The control showed a measurable trailing off of boron into the intrinsic layer. In contrast, a sample prepared with a nitrogen trifluoride flush showed a much sharper p/i interface. Devices prepared using the nitrogen trifluoride flush also displayed greatly improved blue response.

To overcome the problems of the prior art methods for fabricating photovoltaic devices and in accordance with the purpose of the invention, as embodied and broadly described herein, the method of this invention comprises the steps of: forming a front contact layer of transparent conductive material on a transparent superstrate; introducing the superstrate into a deposition chamber; depositing a first doped amorphous silicon-containing layer of a first conductivity type on the front contact layer from a first gaseous mixture containing silane and a first doping gas; flushing the chamber with a decontamination means for substantially removing residual first doping contaminants resulting from deposition of the first doped layer in a gaseous state; depositing an undoped intrinsic layer of amorphous silicon-containing material on the first doped layer from a second gaseous mixture containing silicon; depositing a second doped amorphous silicon-containing layer of a second conductivity type on the undoped intrinsic layer from a third gaseous mixture containing silane and a second doping gas; and forming a back contact layer of conductive material on the second doped layer.

Broadly, the present invention further includes a method of manufacturing amorphous silicon p-i-n photovoltaic devices by DC glow discharge which is improved by flushing the deposition chamber with a gaseous mixture containing nitrogen trifluoride prior to depositing the i-layer of semiconductor material and subsequent to depositing the boron-doped p-layer of semiconductor material.

Broadly, this invention further includes a photovoltaic cell having improved photoresponse to light whose wavelength is in the range of 400-560 nanometers, comprising: a transparent superstrate; a front contact layer of transparent conductive material formed on the superstrate; a p-type doped layer of amorphous silicon-containing material formed on the front contact layer; an undoped i-layer of amorphous silicon-containing material formed on the p-layer with reduced p-dopant contamination at the p/i interface; an n-type doped layer of amorphous silicon-containing material formed on the i-layer; and a back contact layer of conductive material formed on the n-layer.

Broadly, this invention further includes a method for manufacturing layers of semiconductor material comprising the steps of: introducing a first reaction mixture comprising a silicon-containing gas and a first doping gas into a deposition chamber; depositing a first doped layer comprising silicon in the deposition chamber from the first reaction mixture and forming gaseous residual contamination comprising the unreacted first doping gas and its reaction products; contacting said gaseous residual contamination in the chamber with a decontamination gas capable of reacting with the residual contamination and substantially removing the residual contamination from the chamber; and introducing a second reaction mixture comprising a silicon-containing gas into the chamber and depositing a second layer comprising silicon on the first doped layer.

The accompanying drawings, which are incorporated in and which constitute a part of this specification, illustrate an embodiment of the invention and, together with the description, explain the principles of the invention.

Additional advantages of the present invention will be set forth in part in the description that follows and in part will be obvious from the description or can be learned by practice of the invention. The advantages of the invention can be realized and obtained by the structure and method particularly pointed out in the appended claims.

DETAILED DESCRIPTION OF THE INVENTION

Reference now will made in detail to presently preferred embodiments of the invention, one example of which is illustrated in the accompanying drawings.

Figure 1:
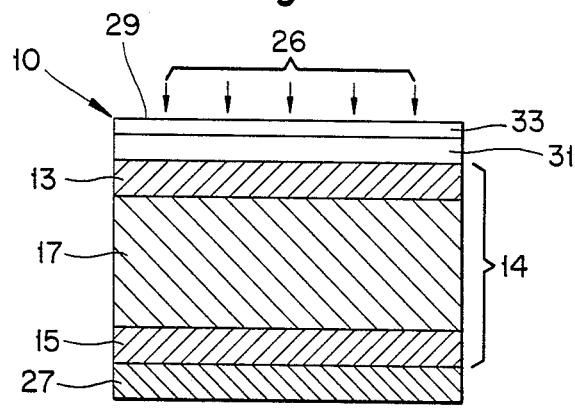
FIG. 1 is a cross-sectional view showing a photovoltaic cell embodying this invention.

Referring to FIG. 1, an embodiment of a photovoltaic cell of the present invention is designated by the numeral 10. For the purpose of describing one embodiment of the present invention, the photovoltaic cell 10 is shown as a p-i-n solar cell. The photovoltaic device 10 typically includes a body 14 of amorphous silicon fabricated by glow discharge in silane, $SiH_4$. (See, e.g., the method shown in U.S. Pat. No. 4,064,521.) Body 14 includes a first doped layer 13, a second doped layer 15 spaced from and opposite the first doped layer 13, and an intrinsic layer 17 in contact with and between the firs and second doped layers 13 and 15. The intrinsic layer 17 is undoped but is usually slightly n-type, as explained more fully, e.g., in U.S. Pat. No. 4,064,521. The first and second doped layers 13 and 15 are of opposite conductivity type. In the exemplary device shown, the second doped layer 15 is of n-type conductivity while the first doped layer 13 is of p-type conductivity. Both the first and second layers 13 and 15 are preferably of a high doping concentration, i.e., greater than $10^{18}/cm^3$ of electrically active dopants. Typically, the n-type second doped layer 15 is doped with phosphorous and the p-type first layer 13 is doped with boron.

A front contact layer 31 is situated on a surface of the first doped layer 13 opposite the intrinsic layer 17. A transparent superstrate 33 is situated on the surface of front contact layer 31 opposite the first doped layer 13. The function of the front contact layer 31 is to be either transparent or semitransparent to solar radiation and to collect current generated in the body 14. Solar radiation 26 enters the device 10 at the incident surface 29 where it is transmitted into the body 14. The front contact layer 31 is typically a single layer of a material such as, for example, indium tin oxide or tin oxide which is both transparent to solar radiation and has good electrical conductivity. The transparent superstrate 33 is typically a layer of a glass material.

A back contact layer 27 is situated on the surface of the second doped layer 15 opposite the intrinsic layer 17. The back contact layer 27 is preferably of a material having reasonable electrical conductivity, such as, for example, aluminum, chromium, tantalum, antimony, or niobium.

In the fabrication of the photovoltaic cell 10, the front contact layer 31 is typically a layer of tin oxide deposited on a layer 33 of glass material. The tin oxide-coated glass superstrate is then placed in a deposition chamber capable of depositing thin film layers of hydrogenated amorphous silicon-containing semiconductor material on the tin oxide side of the superstrate. (See, e.g., U.S. Pat. No. 4,064,521.) DC glow discharge is one suitable method of forming the p-layer, the i-layer, and the n-layer of the photovoltaic cell 10 shown in FIG. 1. Other methods such as RF glow discharge, photo-CVD, or any other appropriate thin-film hydrogenated amorphous silicon deposition method also can be used.

Additionally, fluorinated amorphous silicon deposition can be used in place of hydrogenated amorphous silicon deposition.

P-layer 13 is preferably formed by depositing material from a doped deposition gaseous mixture. When the doping element utilized in p-layer 13 is boron, it can, for example, be introduced into the deposition gas in the form of diborane, $B_2H_6$. The deposition gases preferably comprise a mixture of pure silane and silane containing 0.1-0.3% diborane. The deposition chamber is typically evacuated to a pressure of about $10^{-6}$ torr and then the silane-diborane atmosphere, at a pressure between 0.05 to 1.0 torr, preferably at 0.50 torr, is bled into the chamber while the electrode is brought to a temperature in the range of 150°-500° C.

A glow discharge is initiated in the deposition chamber for the deposition of the first doped layer 13, typically on the order of a few hundred angstroms in thickness. Such deposition typically takes about 20 seconds at 240° C. with a current density of about 0.5 ma/cm² at the electrode 28.

In another embodiment, p-layer 13 is preferably formed as an amorphous silicon alloy material. For example, p-layer 13 may be comprised of a silicon carbon alloy. In this case, methane, $CH_4$, is mixed in the deposition chamber with the silane and diborane in conjunction with the deposition of p-layer 13.

In accordance with the present invention, the deposition chamber is then flushed with a decontamination means for substantially removing residual p-layer doping contaminants in a gaseous state. When diborane is used to dope p-layer 13 with boron, one preferable decontamination means, as embodied herein, is nitrogen trifluoride, $NF_3$. The concentration of nitrogen trifluoride is preferably within the range between 0.1% to 100%, although a concentration of at least 10% is more preferred. A carrier gas such as argon or hydrogen may optionally be used to introduce the nitrogen trifluoride into the deposition chamber. The deposition chamber is preferably flushed for about 10 minutes at a gas flow rate of 100 sccm and 0.5 torr. The substrate temperature is preferably 250° C., although temperatures typically range between 200°-300° C. Other decontamination means which can be used in accordance with the invention include the following gases: $NH_2F$, $NHF_2$, $CNl_3$, $NHCl_2$, $NH_2Cl$, $XeF_6$, $XeF_4$, $XeF_2$, $HF$, $F_2$, $ClF_2$, $ClF_4$, $ClF_6$, $PF_3$, $PF_5$, $PCl_5$, and $COF_2$.

The reduction in boron concentration in the chamber can be calculated according to the formula $C(t) = C_o e^{-Ft/V}$ for a well mixed system, where $C_o$ is the initial concentration of boron, $C(t)$ is the concentration of boron at time t, F is the flow rate (corrected for pressure), and V is the volume of the chamber. For a 100 liter system purged at 0.1 L/min at 100° C. for 10 minutes, a reduction of $5.5 \times 10^{-9}$ in boron concentration is expected. Electrical measurements show interface concentration reduced below one part per million.

After flushing the glow discharge deposition chamber with the decontamination means, silane is bled into the deposition chamber at a pressure between 0.05 to 5 torr, preferably at 0.5 torr. Again, glow discharge is initiated typically for 5 to 20 minutes with a typical current density of from 0.5 ma/cm² to 3.0 ma/cm² at the surface of p-layer 13 for the deposition of i-layer 17 of typically about 0.5 micron in thickness. Deposition of the i-layer can be achieved with the use of other feedstocks, such as, for example, silicon tetraiodide.

Next, about 0.3 to 0.4% phosphine, as the second doping gas, together with silane is bled into the deposition chamber at a pressure between 0.05 to 5 torr, preferably at 0.5 torr, so that the phosphine constitutes typically 0.1 to 2.0% of the silane-phosphine atmosphere. Glow discharge is initiated with a typical current density of from 0.3 ma/cm² to 3.0 ma/cm² at the surface of i-layer 17 for the deposition of n-layer 15, typically on the order of a few hundred angstroms in thickness. Such deposition typically takes about two minutes.

After deposition of n-layer 13, a back contact layer 27 is formed by conventional methods on n-layer 15 to complete the photovoltaic cell 10.

Figure 2:
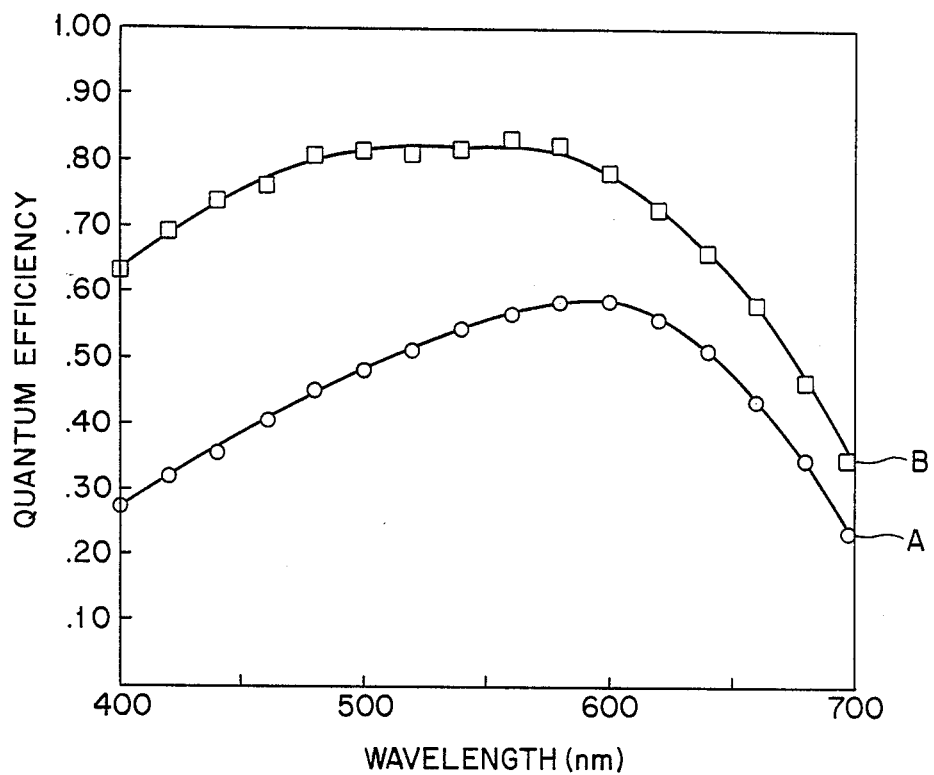
FIG. 2 is a graph comparing the spectral response of a photovoltaic cell of the present invention to that of one fabricated by conventional glow discharge methods.

FIG. 2 compares the quantum efficiency of a photovoltaic device prepared with an a-SiC p-layer 13 with a boron concentration of 0.18% in which a silane flush was used between the p- and i-layer depositions (case A), with a device prepared with reactive nitrogen trifluoride flushing between the p- and i-layer depositions in accordance with the present invention (case B). A substantial increase in blue response can be observed. When a nitrogen trifluoride flush is used, the quantum efficiency at 400 nanometers can be increased from about 0.1 to about 0.7.

Table 1, below, compares the effective electron-hole collection length with and without reactive flushing with nitrogen trifluoride. Flushing results in a tenfold increase in collection length at 400 nanometers with a p-layer doping level of 0.18% boron. Furthermore, an improvement in the red response is also found, suggesting that boron contamination affects the performance of the entire device.

TABLE 1

VARIATION OF COLLECTION LENGTHS WITH

BORON IN THE P-LAYERS AND REACTIVE FLUSHING

| Boron Conc. % | No treatment $l_c/l$ | | | Reactive Flushing with $NF_3$ $l_c/l$ | | |
|---|---|---|---|---|---|---|
| | 400 nm | 560 nm | 700 nm | 400 nm | 560 nm | 700 nm |
| 0.13 | 6 | 8 | 9 | 12 | 12 | 14 |
| 0.18 | 1 | 5 | 6 | 11 | 14 | 12 |
| 0.3 | 3 | 4 | 6 | 8 | 11 | 16 |

It will be apparent to those skilled in the art that modifications and variations can be made in the photovoltaic devices of this invention and in the methods for fabricating such devices without departing from the scope of the invention. For example, while phosphine and diborane are presently prefered doping gases for the first and second doped layers 13 and 15, other suitable doping gases well known in the art can also be used. For example, other suitable p-doping gases include silane mixed with aluminum or gallium; other suitable n-doping gases include silane mixed with arsenic or antimony. In this situation a suitable decontamination gas capable of removing the excess doping contaminants in a gaseous state must be selected.

In the embodiments where an n-i-p photovoltaic cell is desired, the deposition chamber would be flushed with an appropriate decontamination gas after deposition of the n-layer and before deposition of the i-layer. Suitable decontamination means in accordance with this embodiment of the invention include the following gases: $NH_2F$, $NHF_2$, $NCl_3$, $NHCl_2$, $NH_2Cl$, $XeF_6$, $XeF_4$, $XeF_2$, $HF$, $F_2$, $ClF_2$, $ClF_4$, $ClF_6$, and $COF_2$.

Further, photovoltaic devices may be fabricated with a body of selenium or germanium rather than silicon according to the method disclosed herein. Additionally, photovoltaic devices may be constructed with more than one p-i-n or inverted p-i-n junction by flushing the deposition chamber with a suitable decontamination gas immediately prior to the deposition of each i-layer.

The disclosd method is suitable for the manufacture of all types of multi-layered semiconductor material where dopant contamination may be a problem. For example, a body of semiconductor material containing a p-n or inverted p-n junction can be fabricated by flushing the chamber with a suitable decontamination gas immediately prior to the deposition of the following layer. The semiconductor body need not be limited to amorphous silicon, but can contain crystalline silicon as well. The invention in its broader aspect is, therefore, not limited to the specific details and illustrated examples shown and described. Accordingly, it is intended that the present invention cover such modifications and variations, provided that they fall within the scope of the appended claims and their equivalents.

I claim:

1. A method for fabricating a photovoltaic device comprising the steps of:

forming a front contact layer of transparent conductive material on a transparent superstrate;

introducing said superstrate into a deposition chamber;

depositing a first doped amorphous silicon-containing layer of a first conductivity type on said front contact layer from a first gaseous mixture containing silane and a first doping gas; flushing said chamber with a decontamination means for reacting with and substantially removing resdual first doping contaminants resulting from deposition of said first doped layer in a gaseous state;

depositing an undoped intrinsic layer of amorphous silicon-containing material on said first doped layer in said deposition chamber from a second gaseous mixture containing a silicon-containing compound;

depositing a second doped amorphous silicon-containing layer of a second conductivity type on said undoped intrinsic layer from a third gaseous mixture containing silane and a second doping gas; and forming a back contact layer of conductive material on said second doped layer.

2. The method of claim 1, wherein said first doped layer is of p-type conductivity and said second doped layer is of n-type conductivity.

3. The method of claim 2, wherein said first doped layer contains a silicon carbon alloy and said first gaseous mixture includes methane.

4. The method of claim 2, wherein said decontamination means is a gaseous mixture containing nitrogen trifluoride and said first doping gas is a mixture containing silane and diborane.

5. The method of claim 4, wherein said decontamination means is a gaseous mixture of at least 10% nitrogen trifluoride in either argon or hydrogen.

6. The method of claim 5, wherein said chamber is flushed with said decontamination means for at least 600 seconds.

7. The method of claim 4, wherein said first doping gas is silane containing about 0.1–0.3% diborane.

8. The method of claim 2, wherein said second doping gas is a mixture containing silane and phosphine.

9. The method of claim 8, wherein said second doping gas is silane containing about 0.1–2% phosphine.

10. The method of claim 2, wherein said first doping gas is a mixture containing silane and aluminum or gallium.

11. The method of claim 2, wherein said second doping gas is a mixture containing silane and arsenic or antimony.

12. The method of claim 1, wherein said first doped layer is of n-type conductivity and said second doped layer is of p-type conductivity.

13. The method of claim 12, wherein said second doped layer contains a silicon carbon alloy and said third gaseous mixture includes methane.

14. The method of claim 1, wherein the depositions of said first doped layer, undoped intrinsic layer, and second doped layer are achieved through DC glow discharge.

15. The method of claim 1, wherein said front contact layer is tin oxide.

16. The method of claim 1, wherein said back contact layer is aluminum.

17. The method of claim 1, wherein said second gaseous mixture contains silane.

18. The method of claim 1, wherein said second gaseous mixture contains silicon tetraiodide.

19. The method of claim 1, wherein the depositions of said first doped layer, undoped intrinsic layer, and second doped layer are achieved through RF glow discharge.

20. The method of claim 1, wherein the depositions of said first doped layer, undoped intrinsic layer, and second doped layer are achieved through photo-CVD.

21. In a method of manufacturing amorphous silicon p-i-n photovoltaic devices by DC glow discharge, the improvement comprising flushing the deposition chamber with a gaseous mixture containing nitrogen trifluoride prior to depositing the intrinsic layer of semiconductor material in said deposition chamber and subsequent to depositing the boron-doped p-layer of semiconductor material.

22. A method of manufacturing layers of semiconductor material comprising the steps of:

introducing a first reaction mixture comprising a gas containing a silicon-containing compound and a first doping gas into a deposition chamber;

depositing a first doped layer comprising silicon in said deposition chamber from said first reaction mixture and forming gaseous residual contamination comprising said unreacted first doping gas and its reaction products;

contacting said gaseous residual comtamination in said chamber with a decontamination gas capable of reacting with said residual contamination and substantially removing said residual contamination from said chamber; and introducing a second reaction mixture comprising a gas containing a silicon-containing compound into said chamber and depositing a second layer comprising silicon on said first doped layer.

23. The method of claim 22, wherein said second layer is an undoped intrinsic layer.

24. The method of claim 22, wherein said second reaction mixture contains a second doping gas, and said second layer is a doped layer of a conductivity type opposite that of said first doped layer.

25. The method of claim 22, wherein said first and second layers contain amorphous silicon.

26. The method of claim 22, wherein said first and second layers contain crystalline silicon.

* * * * *